US006329587B1

(12) United States Patent
Shoga

(10) Patent No.: US 6,329,587 B1
(45) Date of Patent: Dec. 11, 2001

(54) SEMICONDUCTOR POWER GENERATOR BASED ON A SOURCE OF HEAVY IONS AND ALPHA PARTICLES

(75) Inventor: Munir A. Shoga, Laguna Niguel, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 5 days.

(21) Appl. No.: 09/588,446

(22) Filed: Jun. 6, 2000

(51) Int. Cl.$^{7}$ .................. H01L 37/00
(52) U.S. Cl. .................. 136/202
(58) Field of Search .................. 136/202

(56) References Cited

PUBLICATIONS

Q–Metrics, "Radioisotope Thermolelectric Generator (RTG)", (1996) pp. 1–2 no month provided.
SpaceViews–Cassini, "The RTG Debate", May 1, 2000, pp. 1–3.
Katz, "A Possible Explanation", Oct. 20, 1998, pp. 1.
SpaceViews, "RTG Heat May Account For Anomalous Spacecraft Acceleration", Oct. 1, 1998, pp. 1–2.
RTG Programs, RTG Program is "Go", Sep. 30, 1994, pp. 1–2.
Space Link, "Facts About RTG Misconceptions" Sep. 19, 1989, pp. 1–4.

*Primary Examiner*—Kathryn Gorgos
*Assistant Examiner*—Thomas H Parsons
(74) *Attorney, Agent, or Firm*—T. Gudmestad

(57) ABSTRACT

A power generator includes a current-generating cell having a layer of a fission source of heavy ions and alpha particles, and two semiconductor structures, one on each side of the layer of the fission source. The layer of the fission source is preferably $Pu^{238}$ or $Cf^{252}$. The semiconductor structure is preferably a silicon structure such as a silicon P-I-N diode. The cell includes two metal contact layers, each contacting a respective one of the semiconductor structures at a location remote from the layer of the fission source. A voltage source, such as a thermopile operating with heat produced from the current-generating cell, is in electrical communication with the two metal contact layers to apply a collection voltage across the current-generating cell. Two current collector leads are provided, with each current collector lead being in electrical communication with a respective one of the two metal contact layers.

14 Claims, 3 Drawing Sheets

SEMICONDUCTOR POWER GENERATOR BASED ON A SOURCE OF HEAVY IONS AND ALPHA PARTICLES

This invention relates to a power generator, and, more particularly, to a semiconductor power source that is powered by a fission source of heavy ions and alpha particles.

BACKGROUND OF THE INVENTION

Long-duration space missions require electrical power sources for on-board systems. The electrical power sources must operate reliably for long periods of time using little fuel. Such electrical power sources are to be distinguished from the propulsive engines. Long-duration space missions include, for example, deep-space missions, interplanetary missions, and long-term earth-orbit missions. The electrical power sources must also be relatively light in weight, as they must be initially lifted to orbit.

Solar electrical power sources are widely and successfully used for earth-orbit missions, such as geosynchronous communications satellites. The solar power sources are not practical for deep-space missions and for many lower-orbit missions.

Another approach to such a long-term power source has been small nuclear reactors. A variation of the conventional nuclear reactor favored at the present time for some applications is the Radioisotope Thermoelectric Generator (RTG), which uses the heat produced by fission of fuel to heat a thermopile. The thermopile includes an array of thermocouples which produce an electrical voltage responsive to the heating. In each of these cases, the fuel mass requirement is relatively large. The current version of the RTG utilizes about 10 kilograms of uranium to produce about 60 amperes of current. That is, a large weight of fissionable material must be launched into space on a booster rocket. In addition to the amount of weight that must be lifted, there is an environmental concern with the amount of uranium that is potentially scattered in the event of a booster failure. Additionally, the large amount of excess waste heat generated by such power sources must be radiated into space by large radiators located on the spacecraft, which add to the weight of the spacecraft. An effort is made to radiate the heat uniformly, but there have been indications that slight asymmetries in the amounts of heat radiated in different directions can lead to changes in the velocity of the spacecraft, throwing it off its intended course or orbit.

There is a need for an improved approach to the generation of electrical power for long-duration space missions, particularly deep-space missions. The approach must meet the power requirements, and desirably would overcome or minimize the problems associated with existing power sources. The present invention fulfills this need, and further provides related advantages.

SUMMARY OF THE INVENTION

The present invention provides a power generator that produces electrical power using a small amount of fissioning fuel. The power generator is founded on a layered structure utilizing semiconductor technology. It is compact and may be packaged and encapsulated in a small volume, and is also light in weight. There are no moving parts, and accordingly the power generator is highly reliable. A relatively small amount of waste heat is produced, reducing the problems associated with radiation of the waste heat as compared with conventional electric power sources.

In accordance with the invention, a power generator has a current-generating cell comprising a layer of a fission source of heavy ions and alpha particles, and two semiconductor structures, one on each side of the layer of the fission source. Each semiconductor structure produces electron-hole pairs upon impingement of heavy ions and alpha particles thereon. There are two metal contact layers, each metal contact layer contacting a respective one of the semiconductor structures at a location remote from the layer of the fission source. The power generator also includes a voltage source in electrical communication with the two metal contact layers to apply a collection voltage across the current-generating cell, and two current collector leads, each current collector lead being in electrical communication with a respective one of the two metal contact layers.

The layer of the fission source is preferably either $Pu^{238}$ or $Cf^{252}$, and most preferably $Pu^{238}$. Each semiconductor structure may comprise an intrinsic layer, and at least one doped layer contacting the intrinsic layer. The at least one doped layer is a p-type semiconductor or an n-type semiconductor. Preferably each semiconductor structure comprises a doped silicon structure, most preferably wherein there is at least one doped layer contacting an intrinsic layer. The at least one doped layer is a p-type semiconductor or an n-type semiconductor. Examples include layered P-I, N-I, and P-I-N type structures. (In these conventional abbreviations, P stands for p-type, N stands for n-type, and I stands for intrinsic.) In one specific example of interest, the semiconductor structure is a P-I-N structure having a layer of p-type silicon adjacent to the layer of the fission source, a layer of intrinsic silicon adjacent to and contacting the layer of p-type silicon, and a layer of n-type silicon adjacent to and contacting the layer of intrinsic silicon and remote from the layer of p-type silicon.

The voltage source is preferably a thermopile operating from heat produced by the current-generating cell.

At least two current-generating cells as described may be electrically interconnected in series and/or in parallel through their current collector leads to generate the required voltage and current.

The present approach produces electrical current by collection of the electron-hole pairs produced by ionization reactions in the semiconductor materials resulting from bombardment by heavy ions and alpha particles. The power generator is preferably embodied in a thin structure much like a thin-film microelectronic device. A layer of the fission source is sandwiched between the thin semiconductor structures that produce electron-hole pairs upon impingement of the heavy ions and alpha particles. Metal contact layers externally contact the semiconductor structures to serve as electrodes for application of the collection voltage and collection of the electron-hole pairs as a useful current. The typical total thickness of each current-generating cell is about 5 millimeters, so that numbers of such cells may be packed together and arrayed in the manner of microelectronic devices.

The present approach is to be distinguished from the known Radioisotope Thermoelectric Generator (RTG). The RTG uses heat produced by a fissionable mass to heat a thermopile. The thermopile produces the required current. By contrast, in the present approach the required current is produced by electronic interaction of emitted heavy ions and alpha particles with the semiconductor structure. A thermopile may be present, but it produces only the biasing collection voltage applied to the cell and is not the primary current source. Thus, the heat required to operate the thermopile is very small as compared with that required in the RTG. A battery or other voltage source may be used instead of the thermopile to supply the biasing voltage.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
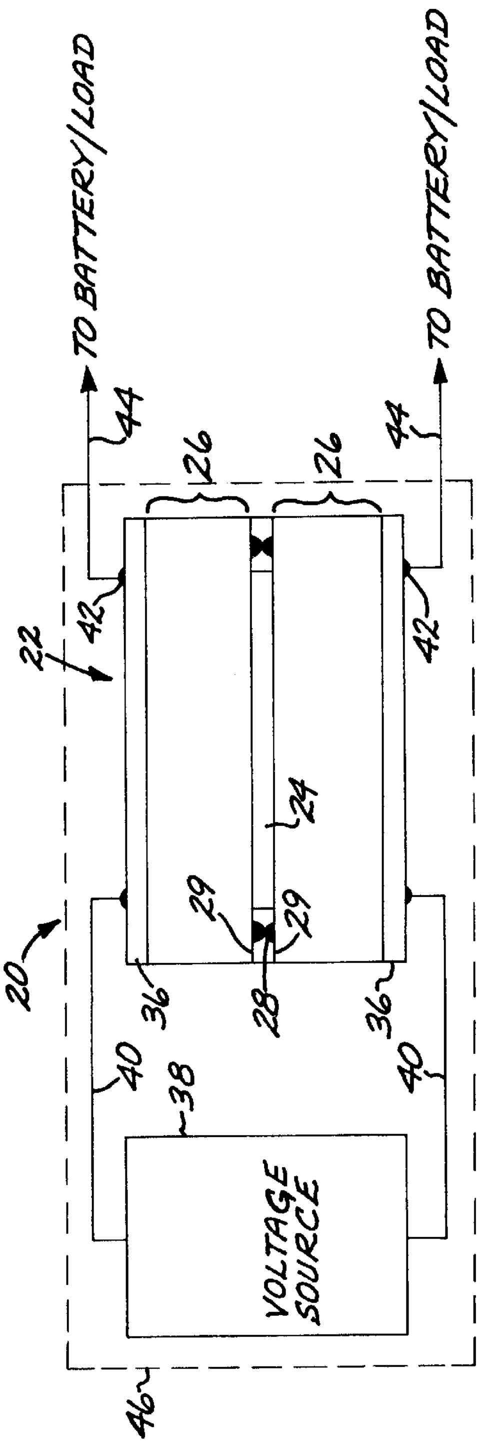
FIG. 1 is a schematic side elevational view of a first embodiment of a power-generating cell according to the invention.
Figure 2:
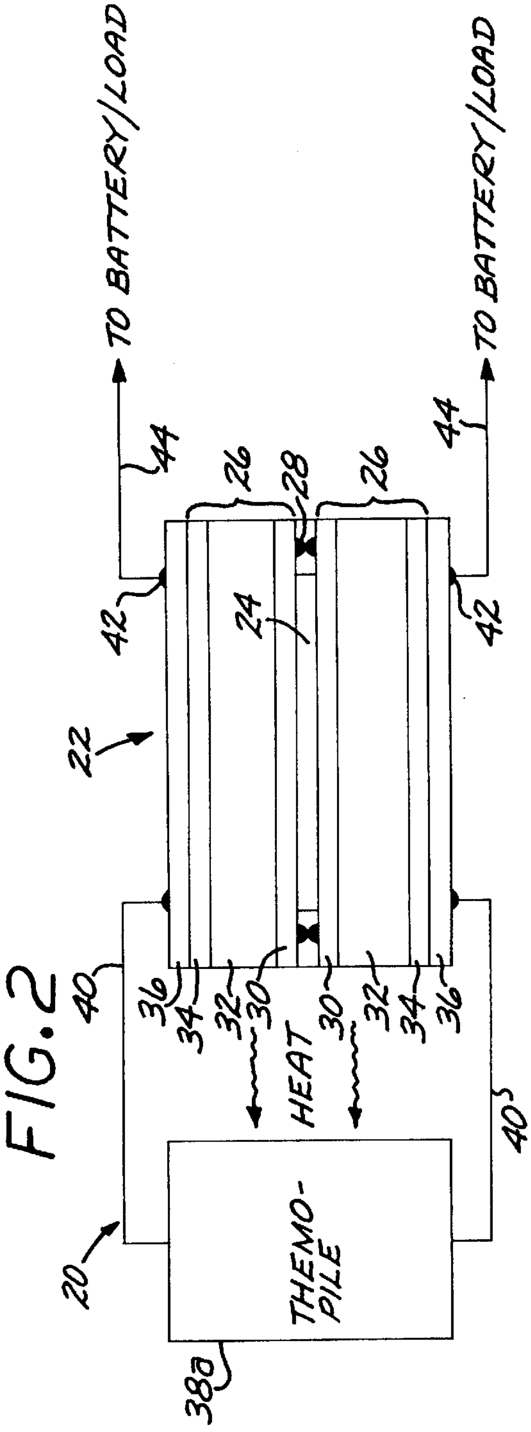
FIG. 2 is a schematic side elevational view of a second embodiment of a power-generating cell according to the invention.
Figure 3:
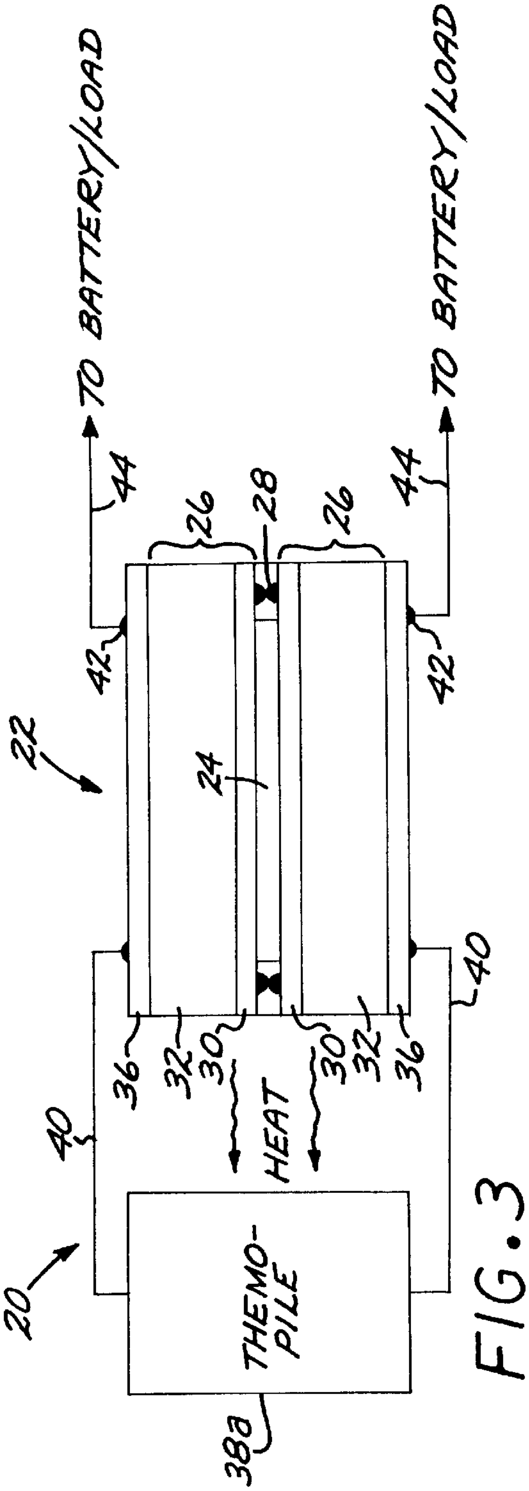
FIG. 3 is a schematic side elevational view of a third embodiment of a power-generating cell according to the invention.
Figure 4:
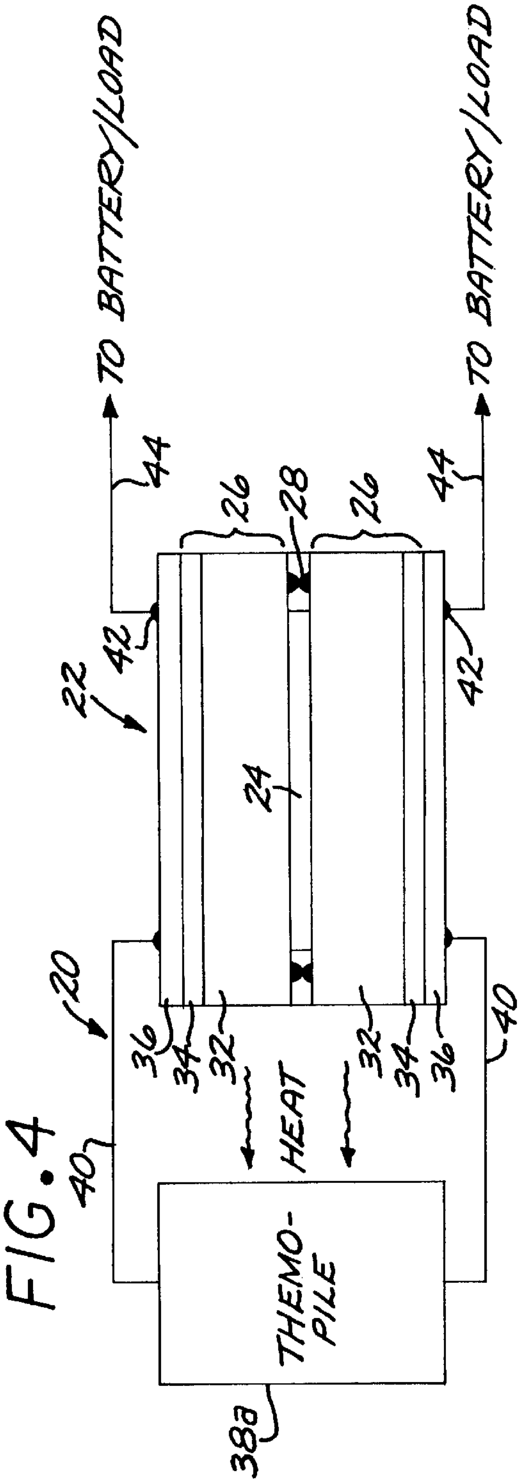
FIG. 4 is a schematic side elevational view of a fourth embodiment of a power-generating cell according to the invention.
Figure 5:
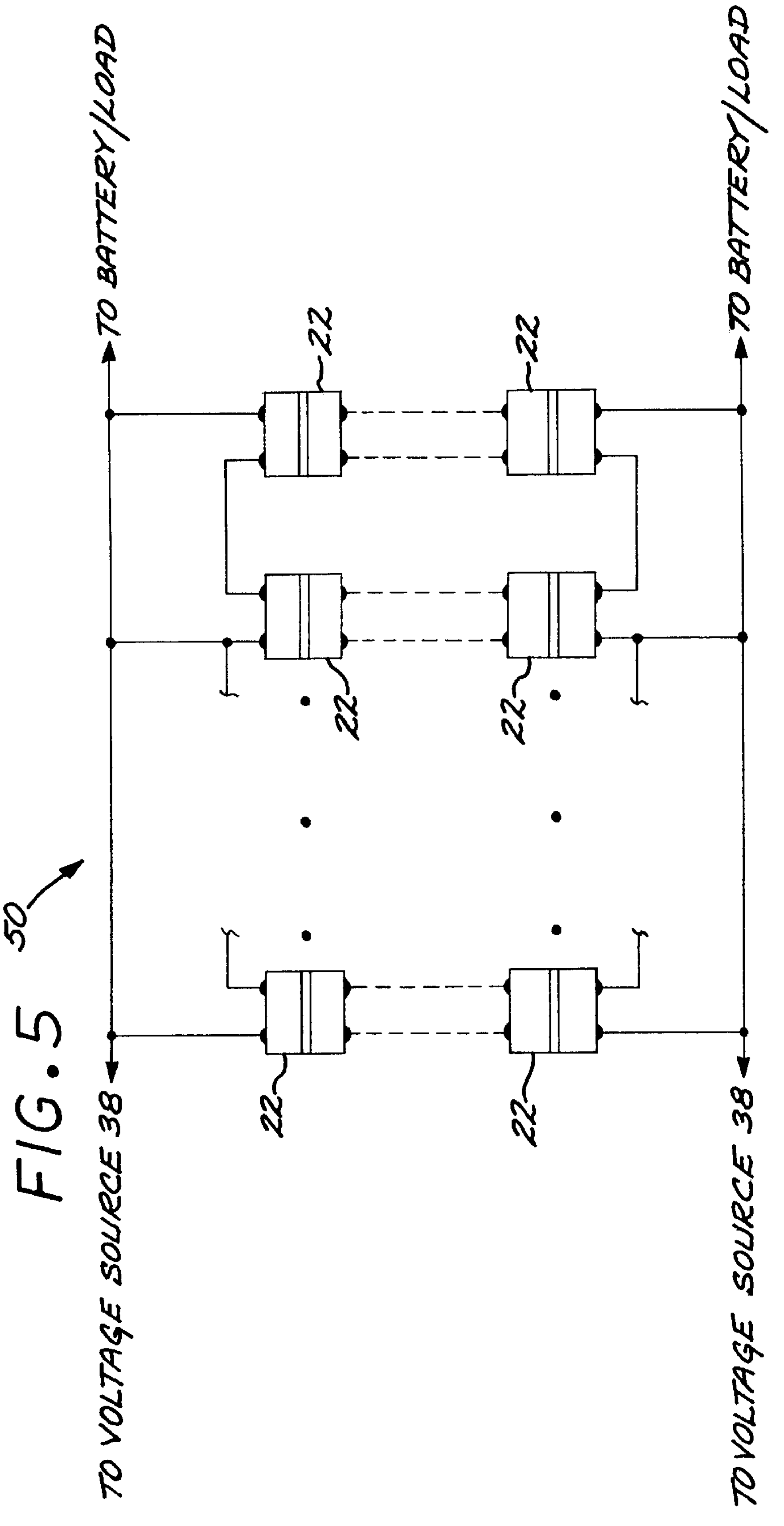
FIG. 5 is a schematic circuit diagram of a group of power-generating cells connected in series and in parallel.

FIGS. 1–4 illustrate four embodiments of a power-generator 20 according to the present invention, with FIG. 1 covering a general form and FIGS. 2–4 showing specific embodiments. The numerical identifiers and description of the elements of FIG. 1 are incorporated into the descriptions of FIGS. 2–4 to the extent applicable.

The power-generator 20 includes a current generating cell 22. The current-generating cell 22 has a layer 24 of a fission source of heavy ions and alpha particles (helium nuclei). Desirably, the material of the layer 24 generates during fissioning a relatively high fraction of heavy ions and alpha particles compared to the output of neutrons. That is, the output of the energetic heavy ions and alpha particles is preferably high relative to the output of the less-energetic neutrons. Two operable materials for use in the layer 24 are $Pu^{238}$ and $Cf^{252}$, with $Pu^{238}$ preferred because it is available in a sheet form suitable for use as the layer 24. The thickness of the layer 24 is not critical, and typically ranges from about 1 to about 4 millimeters, most preferably about 2 millimeters.

The current-generating cell 22 includes two semiconductor structures 26. One of the semiconductor structures 26 is disposed on each side of the layer 24 of the fission source. The semiconductor structures 26 are desirably, but not necessarily, identical in structure. The two semiconductor structures 26 are in electrical communication with each other, through metallic solder bumps 28 on their facing surfaces 29 or other operable interconnects.

Each semiconductor structure 26 produces electron-hole pairs by an ionization and dissociation process upon impingement of heavy ions and alpha particles thereon produced by the layer 24. A number of different types of such semiconductor structures 26 that produce electron-hole pairs are known and used for other purposes. Such semiconductor structures 26 may be based on silicon technology, such as a doped silicon structure, or on other operable technologies. FIGS. 2–4 illustrate three examples of such semiconductor structures 26.

In the embodiment of FIG. 2, which is the presently most preferred embodiment, each semiconductor structure 26 is a P-I-N diode structure that includes a layer 30 of p-type (P) silicon adjacent to the layer 24 of the fission source, a layer 32 of intrinsic (I) silicon adjacent to and contacting the layer 30 of p-type silicon, and a layer 34 of n-type (N) silicon adjacent to and contacting the layer 32 of intrinsic silicon and remote from the layer 30 of p-type silicon and from the layer 24 of the fission source. The thicknesses of these layers 30, 32, and 34 are not critical. Typically, the doped layers 30 and 34 are several micrometers thick, on the order of from about 1 to about 5 micrometers thick, and the intrinsic layer 32 is from about 10 to about 20 micrometers thick. The dopant concentrations of the layers 30 and 34 are not critical, but are typically from about $10^{14}$ to about $10^{18}$ atoms per cubic centimeter.

In the embodiment of FIG. 3, each semiconductor structure 26 is a P-I layered structure, with a p-type silicon layer 30 and an intrinsic layer 32. No n-type layer is present in the embodiment of FIG. 3. In the embodiment of FIG. 4, each semiconductor structure 26 is an N-I layered structure, with an intrinsic layer 32 and an n-type layer 34. No p-type layer is present in the embodiment of FIG. 4. Other operable semiconductor structures that produce electron-hole pairs when bombarded by heavy ions and alpha particles may be used as well.

The current-generating cell 22 further includes two metal contact layers 36. Each metal contact layer 36 contacts a respective one of the semiconductor structures 26 at a location remote from the layer 24 of the fission source. The metal contact layers 36 serve to apply a current-collecting voltage to the faces of the semiconductor structures 26, and also to collect current produced by the responsive migration of the generated electron-hole pairs. The metal contact layers 36 may be made of any operable metal, such as copper, aluminum, or gold, and are typically from about 100 to about 500 micrometers thick.

Without the application of a biasing collection voltage, the electron-hole pairs would remain stationary and would not produce a usable current. To cause the electron-hole pairs to separate and migrate to the respective metal contact layers 36, the opposite polarities of a voltage source 38 are in electrical communication through voltage leads 40 with the two metal contact layers 36 to apply a collection voltage across the current-generating cell 22. The applied voltage is not critical, and is typically on the order of about 30 to about 200 volts. The voltage source 38 may be of any operable type. Examples include batteries and generators. However, these types of voltage sources are not preferred for long-duration missions, because of the potential for failure.

Instead, a preferred voltage source 38 is a thermopile 38*a*, as illustrated in FIGS. 2–4. Thermopiles are arrays of thermocouples that produce an output voltage responsive to a temperature gradient through a metallic interface or other voltage-generating mechanism. The small amount of heat necessary to operate the thermopile is generated as a by-product of the fissioning in the current-generating cell 22. Thermopiles are well known for other applications.

The use of the thermopile 38*a* in the present approach is distinct from that in a conventional RTG. In the RTG, the thermopile produces the primary output current of the device, and accordingly a large number of thermocouples in parallel are required, and a large heat source is required. In the present approach, the thermopile produces a biasing voltage with very little current, and the small heat output of the current-generating cell is sufficient to produce the required voltage.

Under the influence of the biasing voltage produced by the voltage source 38, electron-hole pairs dissociate and migrate to current terminals 42 of the current-generating cell 22. The resulting current is conducted to a battery or to a load by two current collector leads 44, one communicating with each of the metal contact layers 36. The current does not flow to the thermopile 38*a* because of its high impedance.

The described elements of the power generator 20 may be placed into a container 46. The container 46 is preferably hermetic and of a strong construction, with provision for passage of the current-collecting leads 44 in the form of terminals or feedthroughs. There may also be provided external cooling, such as a heat pipe or liquid coolant, to remove any waste heat. The hermetic form of the container serves to encapsulate the layer 24 of the fission source to prevent radiation leakage under normal operating conditions and in the event of an accident. The embodiment of FIG. 1 is illustrated with the container 46, but any of the embodiments of FIGS. 2–5 may have such a container as well.

The power generator 20 described in relation to FIGS. 2–4 comprises a single current-generating cell 22. A power generator 50 illustrated in FIG. 5 has at least two, and preferably a plurality of, current-generating cells 22 electrically interconnected in a desired series arrangement to produce a required voltage and in a desired parallel arrangement to produce a required current output. The individual current-generating cells 22 are interconnected by their current collector leads 44 to produce the required voltage and current.

Calculations have demonstrated that a power generator according to the invention delivers a required current using a much smaller amount of the fission source than is required for conventional reactors such as the RTG. For example, it is estimated that one form of a conventional RTG requires about 10 kilograms of uranium isotope to produce 60 amperes of current. One embodiment of the power generator of the invention is estimated to require about 0.2 kilograms of its fission source to produce 60 amperes of current.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A power generator comprising a current-generating cell comprising a layer of a fission source of heavy ions and alpha particles, two semiconductor structures, one on each side of the layer of the fission source, each semiconductor structure producing electron-hole pairs upon impingement of heavy ions and alpha particles thereon, and two metal contact layers, each metal contact layer contacting a respective one of the semiconductor structures at a location remote from the layer of the fission source;

a voltage source in electrical communication with the two metal contact layers to apply a collection voltage across the current-generating cell; and two current collector leads, each current collector lead being in electrical communication with a respective one of the two metal contact layers.

2. The power generator of claim 1, wherein the voltage source comprises a thermopile.

3. The power generator of claim 1, wherein the layer of the fission source comprises an isotope selected from the group consisting of $Pu^{238}$ and $Cf^{252}$.

4. The power generator of claim 1, wherein the layer of the fission source comprises $Pu^{238}$.

5. The power generator of claim 1, wherein each semiconductor structure comprises a doped silicon structure.

6. The power generator of claim 1, wherein each semiconductor structure comprises an intrinsic layer, and at least one doped layer contacting the intrinsic layer, the at least one doped layer being selected from the group consisting of a p-type semiconductor and an n-type semiconductor.

7. The power generator of claim 1, wherein each semiconductor structure comprises a silicon intrinsic layer, and at least one doped silicon layer contacting the intrinsic layer, the at least one doped layer being selected from the group consisting of a p-type silicon semiconductor and an n-type silicon semiconductor.

8. A power generator comprising at least two current-generating cells as set forth in claim 1, the at least two current-generating cells being electrically interconnected in series.

9. A power generator comprising at least two current-generating cells as set forth in claim 1, the at least two current-generating cells being electrically interconnected in parallel.

10. A power generator comprising a current-generating cell comprising a layer of a fission source of heavy ions and alpha particles, a semiconductor structure on each side of the layer of the fission source, each semiconductor structure comprising a structure selected from the group consisting of a P-I structure, an N-I structure, and a P-I-N structure, and two metal contact layers, each metal contact layer contacting a respective one of the semiconductor structures at a location remote from the layer of the fission source;

a voltage source in electrical communication with the two metal contact layers to apply a collection voltage across the current-generating cell, the voltage source comprising a thermopile operating from heat produced by the current-generating cell; and two current collector leads, each current collector lead being in electrical communication with a respective one of the two metal contact layers.

11. The power generator of claim 10, wherein the layer of the fission source comprises an isotope selected from the group consisting of $Pu^{238}$ and $Cf^{252}$.

12. The power generator of claim 10, wherein the layer of the fission source comprises $Pu^{238}$.

13. A power generator comprising at least two current-generating cells as set forth in claim 10, the at least two current-generating cells being electrically interconnected in series.

14. A power generator comprising at least two current-generating cells as set forth in claim 10, the at least two current-generating cells being electrically interconnected in parallel.

* * * * *